United States Patent [19]
Loewenhardt et al.

[11] Patent Number: 5,942,889
[45] Date of Patent: Aug. 24, 1999

[54] CAPACITIVE PROBE FOR IN SITU MEASUREMENT OF WAFER DC BIAS VOLTAGE

[75] Inventors: Peter K. Loewenhardt; Arthur Sato, both of San Jose; Valentin Todorov, Fremont, all of Calif.

[73] Assignee: Applied Materials, Inc., Santa Clara, Calif.

[21] Appl. No.: 08/878,855

[22] Filed: Jun. 20, 1997

[51] Int. Cl.[6] .......................... G01R 31/265; H01L 21/66
[52] U.S. Cl. .................... 324/72.5; 324/765; 324/158.1; 438/14; 438/17
[58] Field of Search ........................ 324/765, 72, 72.5, 324/158.1, 464; 250/492.2; 438/14, 17

[56] References Cited

U.S. PATENT DOCUMENTS

| | | | |
|---|---|---|---|
| 4,358,686 | 11/1982 | Kinoshita | 250/492.2 |
| 4,859,908 | 8/1989 | Yoshida et al. | 315/111.81 |
| 5,451,884 | 9/1995 | Sauerland | 324/760 |
| 5,557,215 | 9/1996 | Saeki et al. | 324/765 |
| 5,667,701 | 9/1997 | Sato et al. | 438/17 X |
| 5,810,963 | 9/1998 | Tomioka | 438/17 X |

*Primary Examiner*—Glenn W. Brown
*Attorney, Agent, or Firm*—Raymond Moser

[57] ABSTRACT

Apparatus and a concomitant method for estimating voltage on a wafer located in a process chamber. A probe, attached externally to a wall of the process chamber, detects voltage levels generated by a plasma within said process chamber. A relationship between the detected plasma voltage level and the wafer voltage is determined.

14 Claims, 5 Drawing Sheets

CAPACITIVE PROBE FOR IN SITU MEASUREMENT OF WAFER DC BIAS VOLTAGE

BACKGROUND OF THE INVENTION

1. Field of the Invention

The invention relates generally to diagnostic instrumentation for semiconductor wafer processing equipment and, more specifically, to a capacitive probe for in situ measurement of the DC bias voltage accumulated on a semiconductor wafer while being processed in a semiconductor wafer processing system.

2. Description of the Background Art

When monitoring semiconductor wafer processing systems, it is important to accurately measure the DC bias voltage on the wafer. One method of measuring this value is with DC bias "plugs". For example, in the P5000 metal etch chamber, manufactured by Applied Materials of Santa Clara, Calif., DC pickups or "plugs" composed of a graphite or silicon carbide sleeve surrounding an aluminum shaft are placed in direct contact with the plasma. Assuming a near zero potential drop across the plasma, it is possible to estimate the DC bias on the wafer. Unfortunately, these types of "plugs" degrade and represent a consumable material that increases the maintenance costs of the chamber. Additionally, as the "plugs" are consumed, contaminants are released into the processing environment. As such, replacing the "plugs" with a device that measures DC bias voltage without contacting the plasma is preferred.

An improved measurement technique is to measure the amplitude of the RF voltage (e.g., peak-to-peak voltage) at the pedestal and assume the wafer is at the same potential. The measurement of this value is rectified to estimate the DC bias on the wafer. However, this also proved to be a difficult DC bias measurement because of the high level of RF noise proximate the pedestal assembly that penetrates into the electrical measuring circuitry. Additionally, this technique requires substantial modification of the chamber to facilitate coupling a probe and its associated circuitry to the pedestal.

Therefore, there exists a need for a device that can estimate DC bias voltage at a wafer during processing without experiencing the limiting and erroneous effects of RF noise and/or physical degradation of voltage probes that contact the plasma.

SUMMARY OF THE INVENTION

The disadvantages heretofore associated with the prior art are overcome by an inventive probe for use with a plasma etch chamber. The inventive probe utilizes a conductive contact patch mounted to the outside wall of the chamber, e.g., mounted to a quartz window in the chamber wall. From such a location, the contact patch receives the RF voltage oscillations of the plasma and couples the voltage to a voltage measuring instrument. By making certain circuit analysis assumptions, the value coupled to the voltage measuring instrument represents an estimated DC bias voltage on the wafer. Additionally, a method of estimating a voltage on a wafer is taught. The method includes the steps of attaching a probe to an external surface of the chamber, measuring a voltage level from the probe and multiplying the voltage level measured at the probe by a proportionality constant. The probe used in this method is preferably a conductive patch that measures the fluctuations of a plasma voltage.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
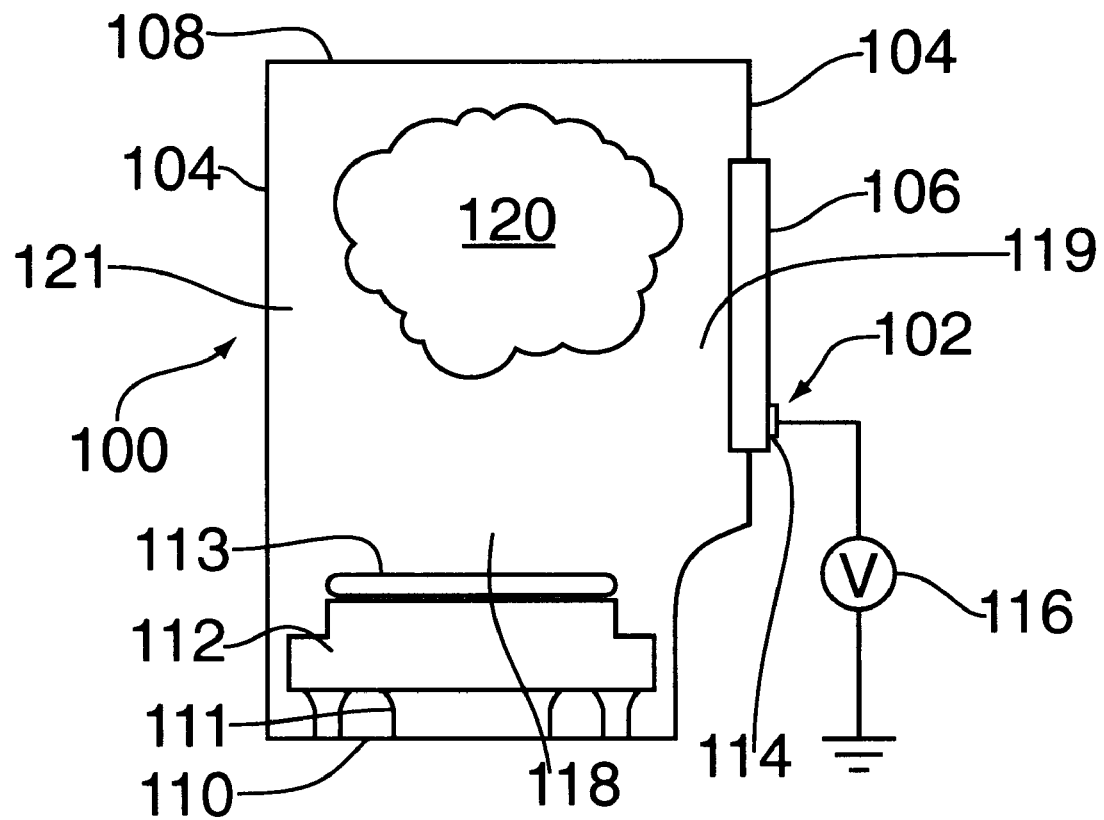
FIG. 1 is a simplified cross-sectional view of a wafer processing chamber with the inventive probe attached to a chamber wall.

FIG. 1 depicts a simplified cross-sectional view of a plasma reaction chamber 100 with the inventive probe 102 attached to one wall of the chamber. For a detailed understanding of the plasma reaction chamber and its operation in processing the wafer, the reader should refer to the drawings and the detailed description contained in U.S. Pat. No. 4,842,683, issued Jun. 27, 1989, incorporated herein by reference. That disclosure discloses a biased, high density plasma reaction chamber manufactured by Applied Materials, Inc. of Santa Clara, Calif.

Specifically, the plasma reaction chamber 100 is a sealed volume defined by chamber walls 104, roof 108 and bottom 110. The chamber bottom 110 supports a pedestal base 111 and pedestal 112. The pedestal 112, in turn, supports a wafer 113 which is to be processed. Additionally, one of the walls 104 contains a window 106 for purposes of viewing or monitoring reactions in the chamber e.g., reaction endpoint detection. Preferably the window is a uniform sheet of quartz approximately 0.635 cm thick. The probe 102 is fabricated from electrically conductive material and is attached to the atmospheric (or external) side of the window 106. The probe 102 is connected to a voltage measuring instrument 116 that is capable of measuring either AC (peak-to-peak) or DC (bias level) voltages. Preferably, the probe is a disk-shaped contact patch with a diameter of 0.25 in (0.635 cm) cut from adhesive-backed copper foil (e.g., 3M product number 1181).

In a typical plasma etching reaction chamber, a wafer 113 is supported by a pedestal 112. The wafer 113 is retained on the pedestal by gravity or mechanical or electrostatic clamping. To aid in the etching process, a plasma 120 is generated in the chamber. Once the appropriate conditions are met, i.e., plasma voltage, temperature, density and ionization levels are established, the wafer processing commences. As discussed above, monitoring and regulating DC wafer bias ensures a good end product, i.e., a wafer with a high yield area and few defects. The inventive probe measures voltage levels that are proportional to the DC bias voltage level on the wafer without physically contacting the plasma and without suffering from interference from RF sources, transmission lines effects, and the like.

Specifically, the metal patch 114 is capable of transmitting electric currents received through the window 106 to the voltage measuring instrument 116. These electric currents are induced by fluctuations in the voltage level of the plasma 120. The fluctuations are the result of the oscillations of the RF power coupled to the pedestal inducing a corresponding oscillation in the plasma potential. Therefore, a reading on the voltage measuring instrument 116 is proportional to a peak-to-peak voltage on the wafer 113. This peak-to-peak voltage correlates to the DC bias voltage on the wafer 113.

Figure 2:
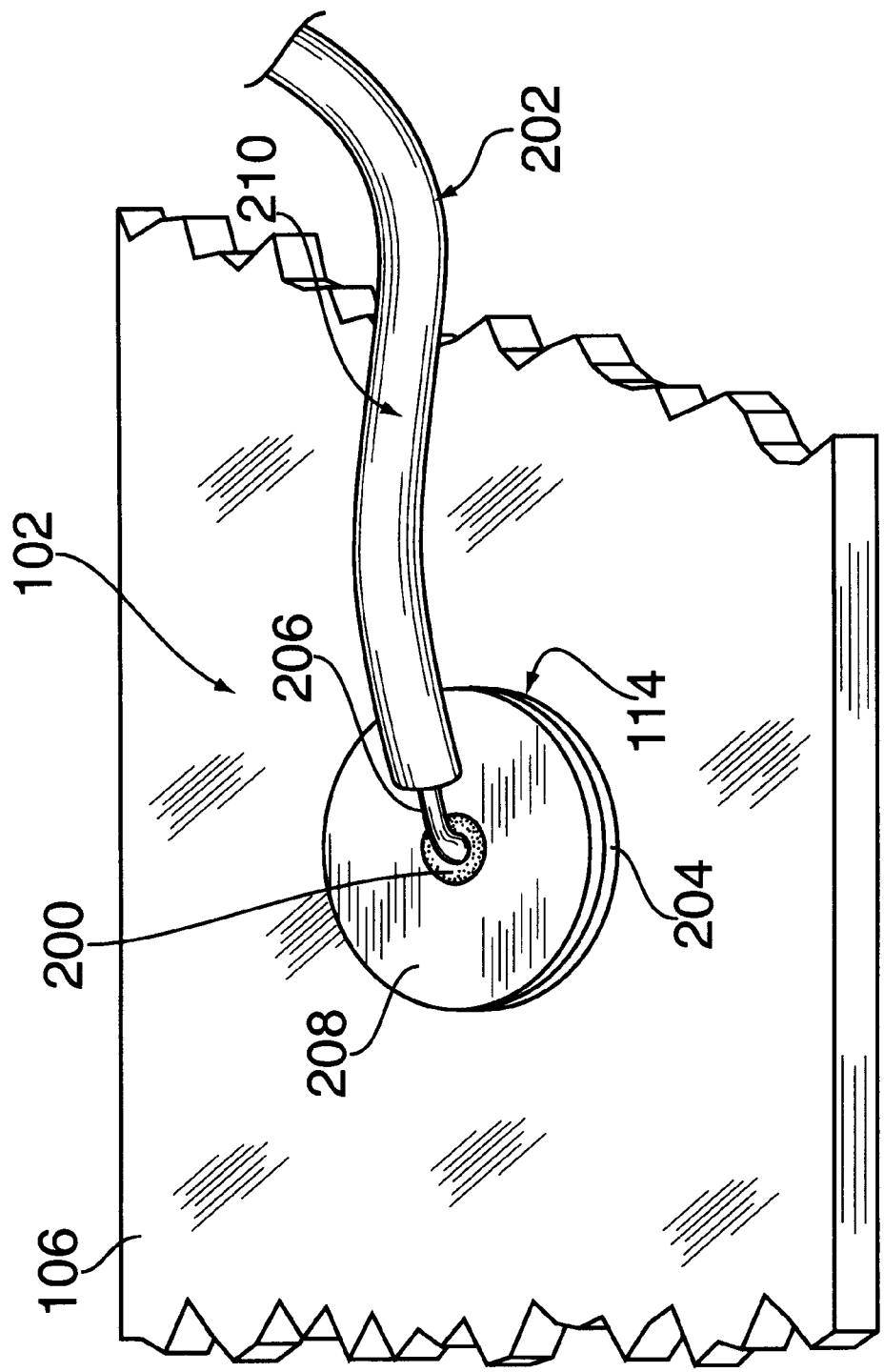
FIG. 2 is a perspective view of the inventive probe.

More specifically, FIG. 2 depicts a perspective view of the probe 102. The probe 102 contains the contact patch 114 with a length of coaxial cable 202. A center conductor 206 of the coaxial cable 202 is soldered to the copper foil 208 of the contact patch 114 using solder 200. An outer shield 210 of the coaxial cable 202 is connected to ground via the voltage measuring instrument. The probe is physically attached to the window 106 by adhesive 204 (e.g., the adhesive backing on 3M product number 1181).

Figure 3:
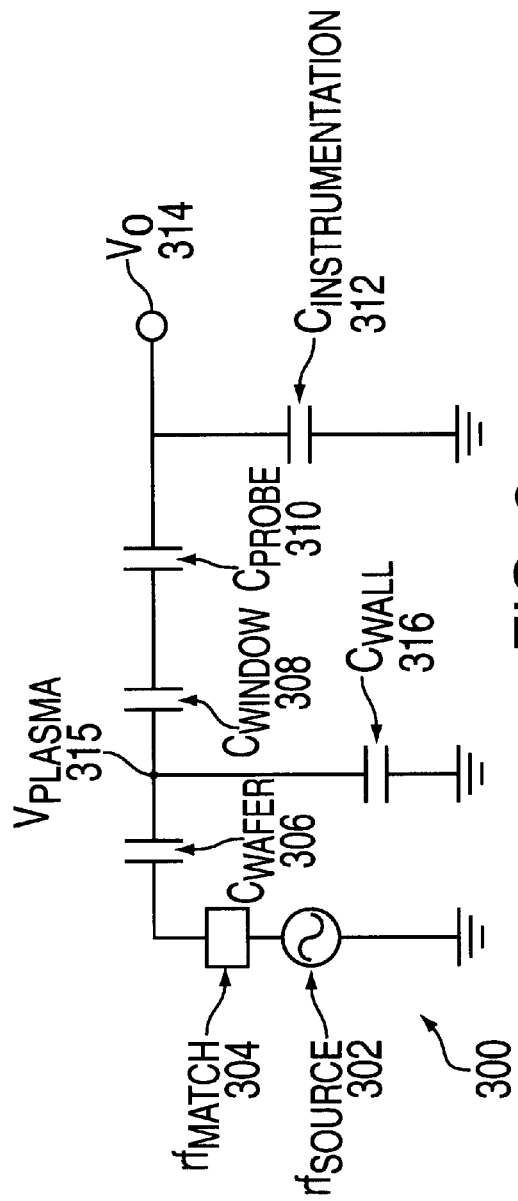
FIG. 3 is a schematic diagram of the representative voltage divider circuit of the inventive probe.
Figure 4:
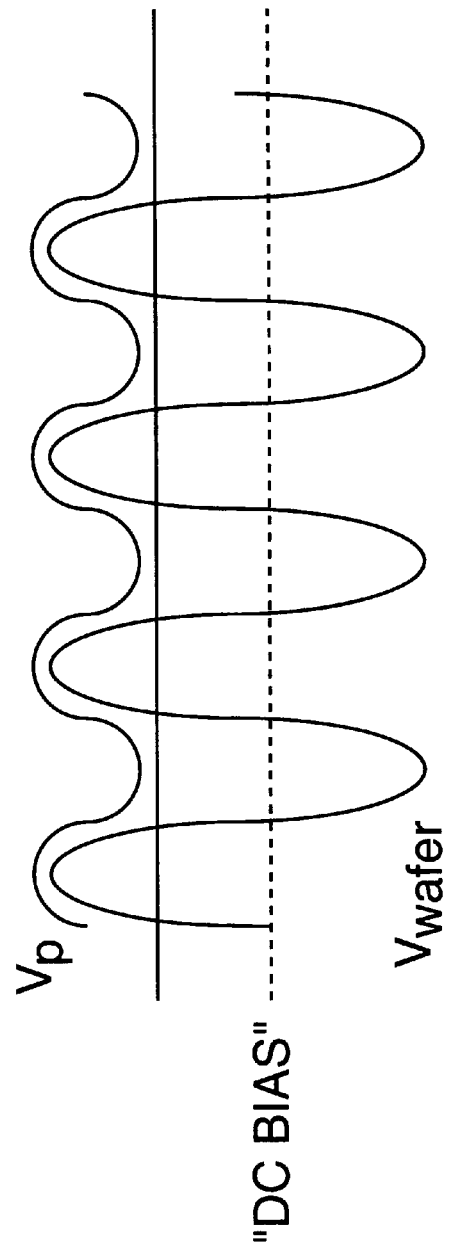
FIG. 4 is a graphical representation of the wafer and plasma voltage oscillations and DC biasing level on the wafer.

The schematic diagram of FIG. 3 depicts a voltage divider circuit 300 that approximates the physical interaction of the elements in the chamber atmosphere with the probe 102. The RF source 302 and matching circuit 304 establish the necessary voltage waveform and impedance to execute the etching process conducted in the chamber. A capacitance exists between the wafer 113 and the plasma 120, across a first plasma sheath 118, which is represented by the capacitor $C_{wafer}$ 306. A second capacitance exists between the plasma 120 and the chamber wall 104, across a second plasma sheath 121 which is represented by the capacitor $C_{wall}$ 316. A third capacitance exists between the plasma 120 and the quartz window 106, across a third plasma sheath 119 and is represented by $C_{window}$ 308. A fourth capacitance exists across the quartz window 106 from the inside surface that contacts the sheath 119 to the contact patch 114. This capacitance is represented by $C_{probe}$ 310. A final capacitance $C_{instrumentation}$ 312 represents the capacitance in the voltage measuring instrument 116.

As configured, the circuit in FIG. 3 is linear and can be analyzed to approximate a reading of the rf voltage $V_{wafer}$ across the plasma sheath 118 represented by $C_{wafer}$ 306. Circuit analysis begins with the assumption that the rf current injected into the chamber 100 by the rf source 302 flows primarily through capacitances $C_{wafer}$ 306 and $C_{wall}$ 316. The branch of the circuit that contains the probe (represented by $C_{probe}$) draws very little current and is present only to sense the plasma potential $V_{plasma}$ at node 315. The amount of current that flows through the probe is controlled by $C_{probe}$. Thus, when $C_{probe}$ is much smaller than $C_{wall}$, the current flowing through the probe branch of the circuit is negligible compared to the total current flowing through $C_{wall}$. Since almost all of the current flows in series through $C_{wafer}$ 306 and $C_{wall}$ 316, the voltage $V_{wafer}$ across $C_{wafer}$ 306 is related to the voltage across $C_{wall}$ 316 (which is by definition the plasma potential $V_{plasma}$) by the following relation:

$$V_{wafer} = \frac{C_{wall}}{C_{wafer}} \times V_{plasma}$$

Thus, if the proportionality constant can be deduced, the voltage across the sheath can be monitored at the wafer by monitoring the plasma potential.

$V_{plasma}$ is measured with the sensing circuit comprising capacitors $C_{window}$ 308, $C_{probe}$ 310, and $C_{instrumentation}$ 312. The output voltage $V_0$ at node 314 is related to $V_{plasma}$ by the following equation:

$$V_0 = \frac{\frac{1}{C_{instrumentation}}}{\frac{1}{C_{instrumentation}} + \frac{1}{C_{window}} + \frac{1}{C_{probe}}} \times V_{plasma}$$

By design, $C_{instrumentation}$ 312 and $C_{probe}$ 310 are chosen to be small, such that $$\frac{1}{C_{window}} \ll \left( \frac{1}{C_{instrumentation}} + \frac{1}{C_{probe}} \right)$$

Since any capacitance scales as C κ*A/d (where A is the area of the capacitor electrodes, κ is the dielectric constant of the window material, (e.g., quartz) and d is the spacing between the electrodes), the above relation can be achieved simply by choosing the thickness of the window to be much greater than the thickness of the plasma sheath at the window:

$$\frac{d_{quartz}}{\kappa_{quartz}} \gg d_{windowsheath}$$

Using the above expressions, the relation between $V_0$ and $V_{plasma}$ can be simplified to:

$$V_0 = \frac{1}{1 + \frac{C_{instrumentation}}{C_{probe}}} \times V_{plasma}$$

The ratio between $V_0$ and $V_{plasma}$ depends only on known quantities that are easily controlled. Combining the two foregoing equations that relate $V_{wafer}$, $V_{plasma}$, and $V_0$ results in the final relation between the output voltage $V_0$ and $V_{wafer}$:

$$V_{wafer} = \frac{C_{wall}}{C_{wafer}} \times \left( 1 + \frac{C_{instrumentation}}{C_{probe}} \right) \times V_0$$

In actual practice, an experimental calibration is performed to find the proportionality constant between $V_0$ and $V_{wafer}$. The assumptions made during the circuit analysis make it possible to expect a linear response. Specifically, peak-to-peak voltage at the probe is proportional to peak-to-peak voltage at the wafer. Since the relationship between peak-to-peak wafer voltage and wafer DC bias is known, peak-to-peak voltage at the probe can be related to DC bias voltage at the wafer. It is known that there is, in general, an offset between the peak to peak voltage and the DC bias of the form $V_{DCbias} = aV_{peak-to-peak} + b$ where b is a constant. Empirical data collected using different source voltage levels (the RF source voltage 302, $V_s$) yields a constant that relates $V_o$ to the wafer voltage.

Figure 5:
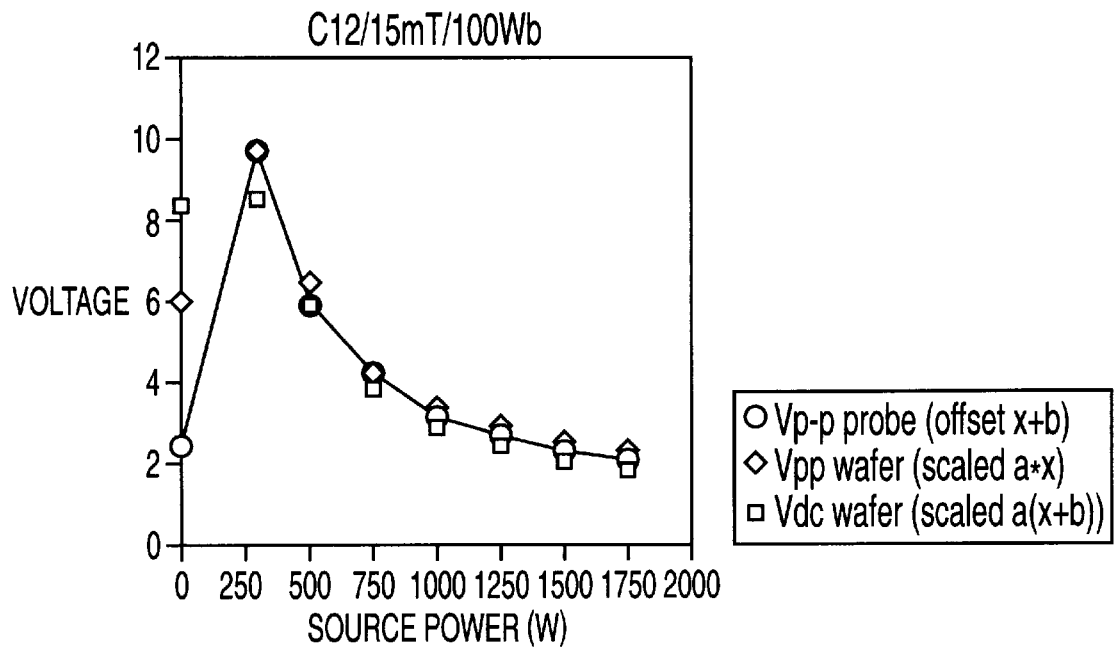
FIG. 5 is a graph of scaled voltage values vs. source power.
Figure 6:
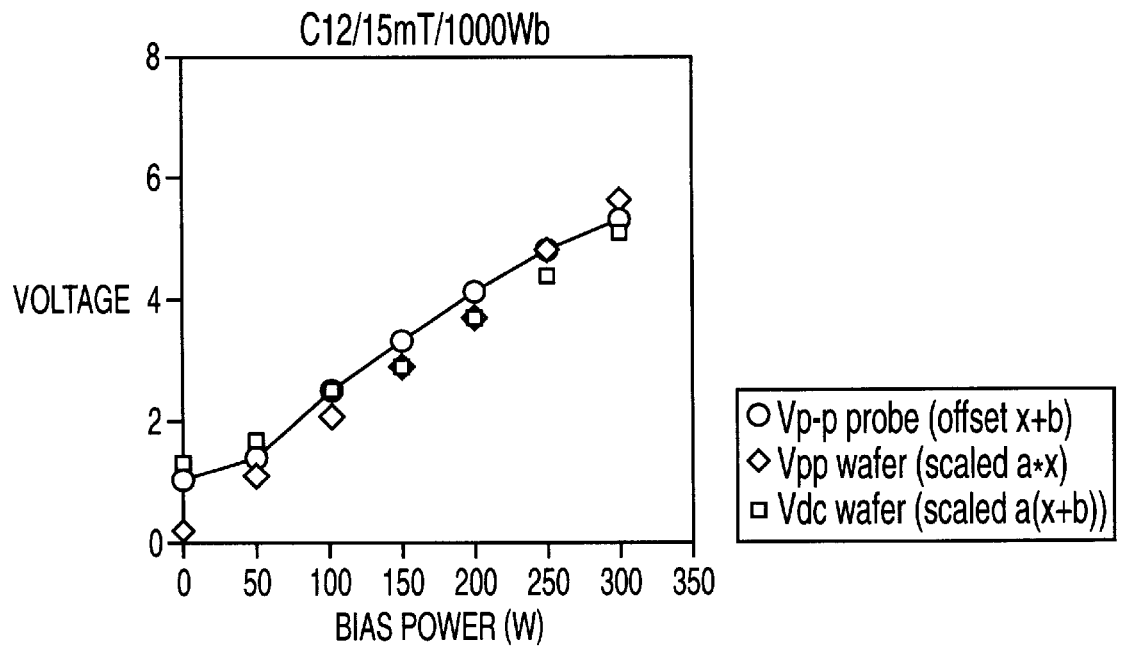
FIG. 6 is a graph of scaled voltage values vs. bias power.
Figure 7:
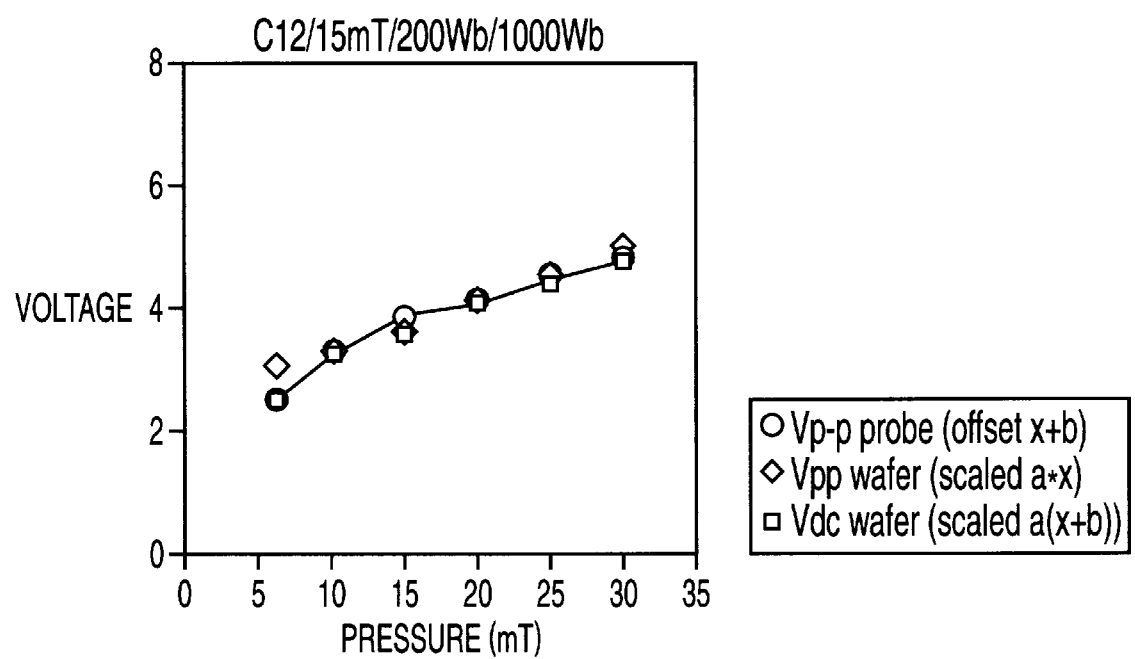
FIG. 7 is a graph of scaled voltage values vs. pressure.

For example, FIG. 5 is a graph of peak-to-peak voltage values measured at the probe (black dots) and wafer (white diamonds) and the DC voltage at the wafer (black square) vs. RF source power. FIG. 6 is a graph of the same voltage values vs. DC bias power and FIG. 7 is a graph of the same voltage values vs. chamber pressure. The voltage values have been scaled for easy comparison of the graphs. In each case, the voltages follow a nearly linear path as the power levels or chamber pressure is increased. As such, the assumptions are supported by the test data and the voltage divider analysis becomes an accurate method of estimating wafer DC bias levels.

The greatest advantage realized by the subject invention is its ability to measure the required data using an external probe that is outside the chamber. As such, there is no chance of signal degeneration caused by nearby transmission lines or RF noise due to proximity of a high voltage source. Additionally, any noise that is detected by the inventive probe may be eliminated by altering the size of patch 114. The signal level viewed at the voltage measuring instrument 116 is proportional to the size of the patch. Therefore, if substantial background noise is detected, the patch size can be increased to improve the signal to noise ratio. In this way, the amount of voltage fluctuations received at the patch is increased in relation to the amount of noise which is assumed constant for a given frequency.

Although various embodiments which incorporate the teachings of the present invention have been shown and described in detail herein, those skilled in the art can readily devise many other varied embodiments that still incorporate these teachings.

What is claimed is:

1. Apparatus for estimating voltage on a wafer located in a process chamber said process chamber having a wall, the apparatus comprising:

a contact member, attached externally to the wall of the process chamber, for detecting voltage levels generated by a plasma within said process chamber that are proportional to said estimated wafer voltage:

a conductor connected to said contact member: and a measuring instrument connected to said conductor for measuring the voltage levels detected by the contact member.

2. The apparatus of claim 1 wherein the chamber wall contains a window upon which the contact member is attached.

3. The apparatus of claim 1 wherein the contact member is a conductive patch.

4. The apparatus of claim 3 wherein the contact member is copper.

5. The apparatus of claim 4 wherein the contact member is a disk-shaped patch of adhesive-backed copper foil.

6. The apparatus of claim 1 wherein the measuring instrument is a voltmeter.

7. Apparatus for estimating a voltage on a wafer located in a process chamber comprising an electrically conductive patch having two sides, wherein one side is adhered to an external side of a window of the process chamber with adhesive and a second side is electrically connected to voltage measuring instrumentation for measuring voltage levels generated by a plasma within said process chamber, where the voltage detected by the probe is proportional to the voltage on the wafer.

8. A method of estimating a voltage on a wafer in a processing chamber comprising the steps of:

attaching a probe to an external surface of the chamber, measuring a voltage level from the probe, and multiplying the voltage level measured at the probe by a proportionality constant, said measured voltage proportional to said estimated wafer voltage.

9. The method of claim 8 wherein the external surface of the chamber upon which the probe is attached is a window.

10. The method of claim 8 wherein the probe measures fluctuations of a plasma voltage.

11. The method of claim 8 wherein the probe is a conductive patch.

12. The method of claim 11 wherein the probe is copper.

13. The method of claim 12 wherein the probe is a disk-shaped patch of adhesive-backed copper foil.

14. The method of claim 8 wherein the proportionality constant is a ratio of capacitances existing in the chamber, probe and a voltage measuring instrument.

* * * * *